United States Patent [19]
Weijland

[11] 3,907,615
[45] Sept. 23, 1975

[54] PRODUCTION OF A THREE-LAYER DIAC WITH FIVE-LAYER EDGE REGIONS HAVING MIDDLE REGION THINNER AT CENTER THAN EDGE

[75] Inventor: Bernard H. Weijland, Beaverton, Oreg.

[73] Assignee: U.S. Philips Corporation, New York, N.Y.

[22] Filed: Oct. 1, 1973

[21] Appl. No.: 402,161

Related U.S. Application Data

[60] Division of Ser. No. 284,720, Aug. 20, 1972, abandoned, which is a continuation of Ser. No. 151,940, June 10, 1971, abandoned, and a continuation of Ser. No. 837,137, June 27, 1969, abandoned.

[52] U.S. Cl. ................ 148/188; 148/187; 148/190; 357/39
[51] Int. Cl. ................ H01l 7/34
[58] Field of Search .......... 148/190, 188, 187, 33.5; 317/235, 41, 41.1, 28; 357/39

[56] References Cited

UNITED STATES PATENTS

| | | | |
|---|---|---|---|
| 3,277,352 | 10/1966 | Hubner | 317/234 R |
| 3,468,729 | 9/1969 | Bentley et al. | 148/190 X |
| 3,476,993 | 11/1969 | Aldrich et al. | 317/235 R |
| 3,649,387 | 3/1972 | Frentz et al. | 148/187 |

*Primary Examiner*—G. Ozaki
*Attorney, Agent, or Firm*—Frank R. Trifari; Leon Nigohosian

[57] ABSTRACT

A method of manufacturing a semiconductor device, comprising the steps of providing a first conductivity type semiconductor body having at the body surfaces opposite conductivity type regions individually comprising first and second portions, the first portions exceeding the second portions in thickness and including therebetween first parts of said semiconductor body and further such that said second portions include therebetween second parts of said semiconductor body individually having a thickness exceeding those of said first parts, and, further, providing at the surface regions of the second portions first conductivity type third semiconductor regions and providing electrical connection means at the surfaces of the structure thus produced.

5 Claims, 6 Drawing Figures

Figure 1:
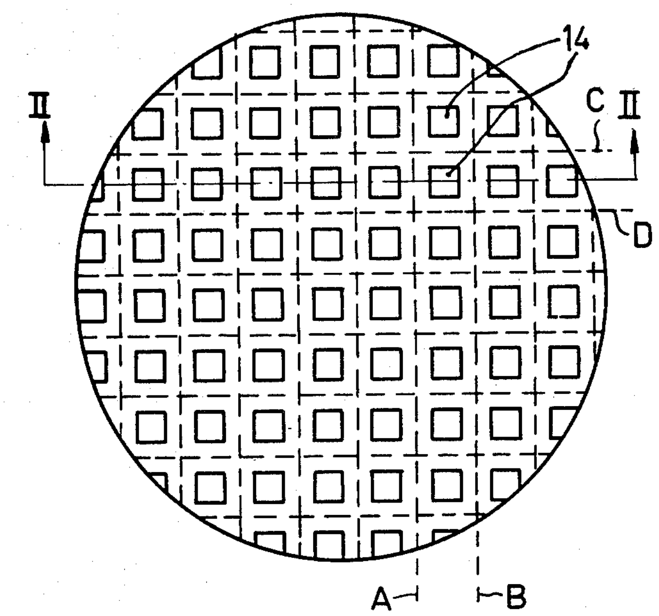

PRODUCTION OF A THREE-LAYER DIAC WITH FIVE-LAYER EDGE REGIONS HAVING MIDDLE REGION THINNER AT CENTER THAN EDGE

This is a division of abandoned application Ser. No. 284,720, filed Aug. 20, 1972 which is in turn a continuation of abandoned Ser. No. 151,940 filed June 10, 1971 and Ser. No. 837,137, filed June 27, 1969, and claims priority under Holland Application 6809127 filed June 28, 1968.

The invention relates to a semiconductor device suitable for use in a trigger circuit and comprising a plate-shaped semiconductor body which is bounded by two substantially parallel main surfaces which are provided with connection contacts, between which main surfaces are situated successively a first region of one conductivity type adjoining the first main surface, a second region of the opposite conductivity type, and a third region of one conductivity type adjoining the second main surface, which regions are separated from each other by two p-n junctions which extend parallel to the main surfaces substantially throughout their surface.

Such devices are known and are frequently used in trigger circuits. In circuit technology they are known as "Diac" (see for example "Funkschau", 1968, vol. 1, pp. 5–28, particularly FIG. 8).

At a predetermined voltage between the connection contacts such a device can be in two different stable states and therefore constitutes a bistable element. In one state, the poorly conducting state, the current through the device is considerably lower than in the readily conducting state. Starting from the poorly conducting state, the bistable element can pass from the poorly conducting into the readily conducting state at a given voltage by increasing the voltage difference between the connection contacts. The bistable element can be brought back into the poorly conducting state by interrupting the current.

The known devices of the type described suffer from the drawback that their electrical properties, and particularly the voltage at which transition from the poorly conducting into the readily conducting state occurs, are very sensitive to variations which occur at the semiconductor surface where p-n junctions intersect said surface.

Furthermore, with respect to, for example, pnpn-structures, the known devices described have the drawback that even in the readily conducting state the voltage drop across the device is still rather high.

It is the object of the invention to provide a structure in which the above-mentioned drawbacks associated with known devices are avoided or are at least reduced considerably.

The invention is based on the recognition of the fact that, by increasing the mutual distance of the p-n junctions between the first, second and third regions at the area where they emerge from the surface and also incorporating there a five-layer-structure, a device can be obtained which is much less sensitive to leakage current variations at the semiconductor surface with respect to known structures, while in addition during and after the transition from the poorly conducting into the readily conducting state, the voltage drop across the device is minimized.

According to the invention, a semiconductor device of the type mentioned in the preamble is therefore characterized in that the second region comprises a central part having a smaller thickness and an edge portion having a larger thickness and extending up to the edge of the semiconductor plate, that surface regions of the opposite conductivity type are provided in the parts of the first and the third region which are situated between the said edge portion and a main surface, and that each of the main surfaces is at least partly covered with an electrode layer which contacts both the surface region adjoining the relative main surface and the first region respectively the third region.

The device according to the invention has the advantage that the bistable element is substantially insensitive to leakage current variations at the surface, by increasing the leakage path at the edge of the semiconductor plate between the p-n junctions which separate the first, second and third regions from each other. Moreover, during the transistion from the poorly conducting state into the readily conducting state, the voltage drop across the device will reduce to a value which corresponds to the voltage drop across a pnpn-structure, which foltage drop generally is considerably smaller than that across a three-layer-structure in the readily conducting state. This is due to the fact that upon increasing the voltage across the device, the following mechanisms become successively operative. Upon reaching the firing voltage, the pnp- and npn-structures, respectively, situated in the center of the semiconductor plate pass from the poorly conducting state into the readily conducting state. Large quantities of minority charge carriers are injected in the said edge portion of the second region, so that in said edge portion a strong conductivity modulation occurs. As a result of this, the pnpn-structure consisting of the first, second and third regions and one of the said surface regions is transferred from the poorly conducting state into the readily conducting state, so that the voltage drop across the device falls to a value which is substantially equal to that across the said pnpn-structure, which voltage drop is of the order of 1 Volt.

The thickness of the edge portion of the second region must be such that the injection occurring by the firing of the inner pnpn- and npn-structures, respectively, is capable of producing a sufficiently strong conductivity modulation in said edge portion. When said edge portion is too thick, this will not be possible any longer so that no firing of the later structure at the edge occurs. The value of the maximum thickness of the edge portion of the second region depends upon the life of the minority charge carriers in said edge region.

In order to eliminate the said leakage current at the edge surface of the semiconductor plate as much as possible, the thickness of the edge portion of the second region is preferably chosen to be at least equal to double the thickness of the central portion.

The semiconductor body may be manufactured from a variety of semiconductor materials, in which moreover the various regions may consist of different semiconductor materials. Preferably, however, the whole semiconductor body is manufactured from silicon, inter alia in connection with the technological advantages occurring during the manufacture.

The doping of the second region is advantageously chosen to be between about $5 \times 10^{17}$ atoms/cm$^3$ and about $10^{18}$ atoms/cm$^3$, in connection with the occurring suitable values of the breakover voltage between the poorly conducting and the readily conducting state of the device.

According to an important preferred embodiment the thickness of the central portion of the second region is chosen to be between approximately 10 $\mu$m and approximately 20 $\mu$m. With this thickness of the central portion and with the said doping concentration, for the pnp- and npn-structures, respectively, situated in the center of the semiconductor plate, an optimum ratio is obtained between the breakover voltage and the voltage drop in the readily conducting state which would occur in this three-layer structure in the absence of the five-layer-structure in the edge region. As a result of this the current-voltage characteristic of the device as a whole is also favorably affected, notably the injection in the edge portion of the second region, which produces the firing of the edge region of the semiconductor plate.

According to a further preferred embodiment the second region consists of n-type silicon, as a result of which the surface regions with the second region and the intermediately situated first and third regions, respectively, form npn-transistors. As is known, these have a larger amplification factor than pnp-transistors with otherwise the same dimensions and doping concentrations, since the mobility of electrons in silicon is considerably higher than the mobility of holes. The firing of the edge regions is facilitated by the higher amplification factor of said npn-transistors.

A particularly elegant method of manufacturing the device according to the invention is characterized in that a layer of glass containing a first doping material of one conductivity type is provided on either side of a plate-shaped semiconductor body of the opposite conductivity type, which layer of glass is then removed beyond the central portion of the semiconductor plate, after which a second doping material of one conductivity type with a lower surface concentration than the first doping material, and a third doping material of the opposite conductivity type which is retained by the glass layer and has a higher surface concentration and a lower diffusion constant than the second doping material are simultaneously diffused in the same diffusion step in the semiconductor plate, so that a five-layer-structure is formed in the edge region of the plate and a three-layer-structure is obtained in the central region of the plate, after which the formed p-n junctions are exposed by removing material at the edge surface of the plate.

In this method, the whole semiconductor structure of the device is obtained in one single diffusion step, in which it is also possible that a large number of similar devices are manufactured on one semiconductor plate.

In order that the invention may readily be carried into effect, it will now be described in greater detail, by way of example, with reference to the accompanying drawings, in which FIG. 1 is a diagrammatic plan view of a semiconductor plate comprising a number of devices according to the invention during a stage of their manufacture.

Figure 2:
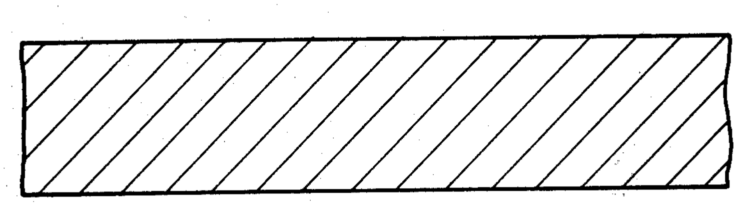
Figure 3:
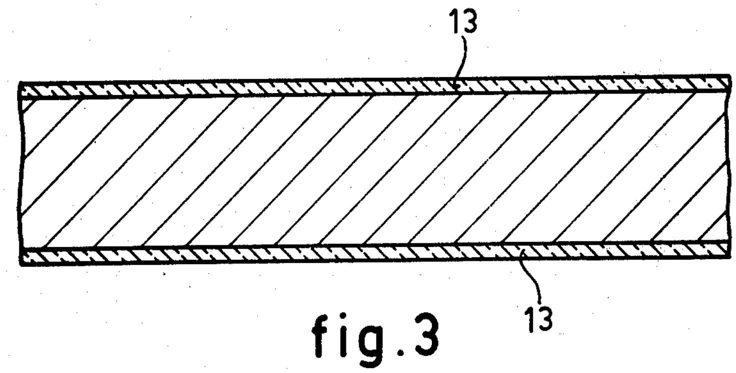
Figure 4:
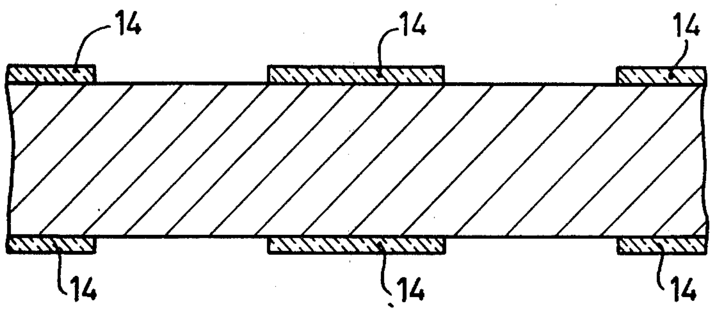
Figure 5:
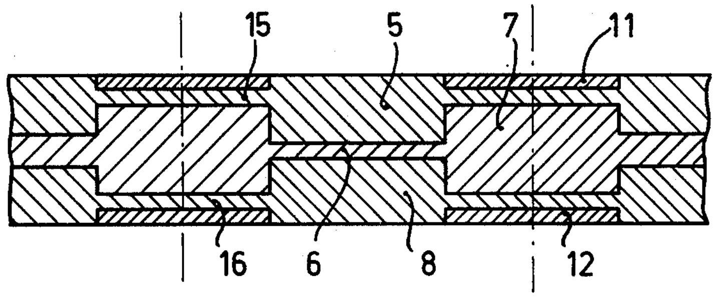
Figure 6:
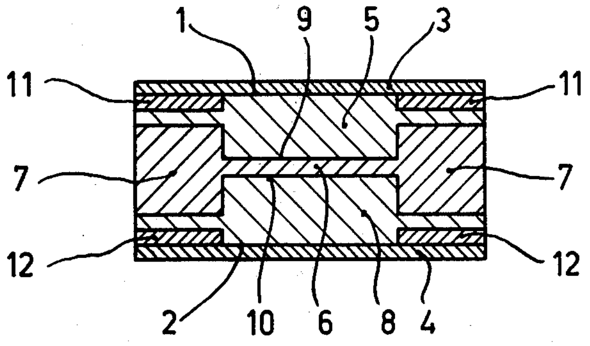

FIGS. 2 to 5 are diagrammatic cross-sectional views of a part of the semiconductor plate shown in FIG. 1 taken on the line 11—11 with a device according to the invention bounded by the lines A, B, C and D of FIG. 1, in successive stages of manufacture, FIG. 6 is a diagrammatic cross-sectional view of a device according to the invention obtained by using the method described with reference to FIGS. 2 to 4.

FIG. 1 is a plan view of a silicon disc having a diameter of 24 mm and a thickness of 115 $\mu$m. Approximately 250 devices to be described below can be manufactured on the same disc. For reasons of clarity a smaller number of said devices with respect to the diameter of the disc are shown in FIG. 1, on a relatively too large scale in plan view. The device which is bounded by the lines A, B, C and D of FIG. 1 is shown in FIG. 6 as a diagrammatic cross-sectional view taken on the lines II—II of FIG. 1. This device comprises (see FIG. 6) a plate-shaped semiconductor body of silicon which is bounded by two substantially parallel main surfaces 1 and 2 which are provided with connection contacts 3 and 4 between which main surfaces extend successively a first region 5 of p-type silicon, a second region (6, 7) of n-type silicon with a resistivity of approximately 0.03 ohm-cm and a substantially homogeneous doping of $7 \times 10^{17}$ donor atoms/cm$^3$ and a third region 8 of p-type silicon. These three regions are separated from each other by two p-n junctions 9 and 10 which extend parallel to the main surfaces 1 and 2 substantially throughout their surface. The second region according to the invention comprises a central portion 6 having a thickness of 15 $\mu$m and an edge portion 7 having a thickness of 65 $\mu$m extending up to the edge of the semiconductor plate. N-type surface regions 11 and 12 are provided in the parts of the first region 5 and the third region 8 which are situated between the edge portion 7 and the main surface 1, and the main surface 2, respectively. The main surface 1 is covered with a metal layer 3 which makes an ohmic contact with the first region 5 and with the surface region 11. The main surface 2 is covered with a metal layer 4 which contacts the third region 8 and the surface region 12.

The operation of this device is as follows. When a negative voltage is set up at the electrode layer 3 with respect to the electrode layer 4 and said voltage is gradually increased, an avalanche effect will occur at a voltage of approximately 30 volts at the p-n junction 9 so that the pnp-structure formed by the regions 5, 6 and 8 passes from the poorly conducting state with very low current intensity into a readily conducting state having a higher current intensity and a voltage drop of approximately 20 volts across the pnp-structure, under the influence of the transistor action which in this three-layer structure occurs due to the comparatively small thickness of the region 6.

In this readily conducting state, a strong injection of holes occurs in the n-type region 6 and also in the region 7 where they give rise to conductivity modulation. As a result of said conductivity modulation, the pnpn-structure which is formed by the regions 8, 6, 5 and 11 which, up to this instant, was in the poorly conducting state as a result of the comparatively large thickness and high resistivity of the region 7, will be fired. The voltage drop across said pnpn-structure and hence also the voltage drop across the whole device between the electrode layers 3 and 4, will fall to a value of approximately 1 volt with which the readily conducting stable state of the device is reached.

Due to the symmetry of the device, the same mechanism will become operative when a voltage is applied in the opposite direction between the electrode layers 3 and 4, in which, however, the effective pnpn-structure is formed by the regions 5, 6, 8 and 12.

The leakage current at the edge of the silicon plate, and as a result thereof the instability of the electrical properties of the device according to the invention, are considerably reduced since the p-n junctions 9 and 10 at the edge are more than 4 times further apart from each other than in the center. The firing characteristics of the three-layer-structure in the center have thereby become substantially independent of the surface conditions at the edge.

The device described can be manufactured very simply as follows: Starting material is an n-type silicon disc having a resistivity of approximately 0.03 ohm-cm $7\times 10^{17}$ donor atoms/cm$^3$, a diameter of 24 mm and a thickness of 115 $\mu$m. This disc is shown as a plan view in FIG. 1, and as a partial cross-sectional view in FIG. 2, taken on the line II—II of FIG. 1.

A layer of borosilicate glass is then provided on said disc by heating the disc at a temperature of 500°C in a nitrogen stream to which tetra-ethoxy-silane has been added which is doped by approximately 8% by volume of triethylborane. After 25 minutes a layer of glass 13, thickness 0.4 $\mu$m, is obtained on the silicon (see FIG. 3). This layer of glass is used as a source for the subsequent diffusion.

By means of photoresist methods conventionally used in semiconductor technology, said layer of glass is then etched away partly to form the pattern shown in FIG. 1, in which square windows of glass 14 remain (see also FIG. 4), dimensions $500 \times 500$ $\mu$m, which are separated from each other by tracks, 500 $\mu$m wide, where the layer of glass is etched away.

The silicon disk is then subjected to diffusion in a sealed evacuated quartz capsule in the presence of a source of boron-doped silicon powder having a concentration of $7 \times 10^{18}$ atoms/cm$^3$ and a source of arsenic-doped silicon powder having a concentration of $2 \times 10^{19}$ at/cm$^3$. The diffusion is carried out at 1280°C for 40 hours. The parts 14 of the glass layer constitute a diffusion source having a surface concentration of $5 \times 10^{20}$ boron atoms/cm$^3$, while the two other diffusion sources give rise to surface concentrations which are equal to those of the doped silicon powder.

As a result of this diffusion, in which the diffusion constant of arsenic lies considerably lower than that of boron, the structure shown in FIG. 5 is obtained, after treatment in a hydrofluoric acid solution to remove the glass layers, the thickness of the p-type regions 5 and 8 being 50 $\mu$m, that of the regions 11 and 12 being 10 $\mu$m, that of the regions 7 being 65 $\mu$m. The intermediate regions 6, 15 and 16 therefore have all a thickness of 15 $\mu$m.

The disc is then covered with a nickel layer ((3, 4), see FIG. 6), by electroless nickel-plating. The nickel layer is then gold-plated after which the individual devices shown in cross-section in FIG. 6 are obtained by sawing along the lines A, B, C, D (see FIG. 1). The edge of said devices is then etched to eliminate crystal defects at the surface resulting from the sawing which might influence the electrical properties of the p-n junctions. The electrode layers 3 and 4 are then provided with connection conductors after which the assembly is provided in a suitable envelope.

It will be obvious that the invention is not restricted to the example described, but that many variations are possible to those skilled in the art without departing from the scope of this invention. For example, the invention is not restricted to silicon as a semiconductor material, while within the scope of the invention those skilled in the art can also vary the geometry of the structure within wide limits, while observing theconditons essential for the effect of the invention, as described in the specification.

What is claimed is;

1. A method of manufacturing a semiconductor device, comprising the steps of:

a. providing a semiconductor body having a first conductivity type, said body having first and second major surfaces;
b. providing at said major surfaces respective first and second regions of a second opposite conductivity type, each of said first and second regions comprising first and second portions, said step of providing said regions being executed such that said first portions exceed said second portions in thickness and include therebetween first conductivity type first parts of said semiconductor body and further such that said second portions include therebetween first conductivity type second parts of said semiconductor body individually having a thickness exceeding those of said first parts;
c. providing at respective surface regions of only said second portions third semiconductor regions having said first conductivity type, said third regions defining respective third and fourth surfaces together with said first and second regions respectively; and
d. providing electrical connection means at said third and fourth surfaces.

2. A method of manufacturing a semiconductor device, comprising the steps of:

a. providing a plate-shaped semiconductor body comprising first and second surfaces and having a first conductivity type;
b. providing on said first and second surfaces a glass layer comprising a first doping material of a second opposite conductivity type, said layer comprising areas only partially covering said first and second surfaces such that portions of said first and second surfaces located between said areas are exposed;
c. simultaneously diffusing said first doping material into the covered portions of said first and second surfaces to a first depth in said semiconductor body and diffusing into said exposed surface portions of said semiconductor body both a second doping material of said second conductivity type having a lower surface concentration than said first doping material and a third doping material of said first conductivity type, said third doping material being characterized by being retained by said glass layer and diffused to a second depth in said body less than said first depth and having a higher surface concentration and a lower diffusion coefficient than said second doping material, said second doping material being diffused in said body to a third depth intermediate said first and second depths, so as to form at only a lateral region of said body a five-layer structure having regions of alternating conductivity type that form plural p,n junctions and to form at a central region of said body a three-layer structure having alternating conductivity type;
d. removing material at said lateral region of said body so as to expose said p,n junctions; and
e. providing electrodes at opposite faces of the structure thus produced.

3. A method as defined in claim 2, wherein said diffusion of said first doping material forms oppositely disposed first regions in said semiconductor body and said diffusion of said second doping material forms oppositely disposed second regions in said body, said first and second doping materials being diffused such that the distance between opposite said second regions is at least twice that between opposite said first regions.

4. A method as defined in claim 3, wherein said first and second doping materials are diffused into said semiconductor body such that said distance between said opposite second regions is at least four times that between opposite said first regions.

5. A method as defined in claim 2, wherein said semiconductor body has an n type conductivity.

* * * * *

UNITED STATES PATENT AND TRADEMARK OFFICE
CERTIFICATE OF CORRECTION

PATENT NO. : 3,907,615

DATED : September 23, 1975

INVENTOR(S) : BERNARD H. WEIJLAND

It is certified that error appears in the above-identified patent and that said Letters Patent are hereby corrected as shown below:

On the Title page, please insert the following section:

--[30] Foreign Application Priority Data

June 28, 1968 Netherland------------6809127--.

Signed and Sealed this

*twenty-fourth* Day of *February 1976*

[SEAL]

*Attest:*

RUTH C. MASON
*Attesting Officer*

C. MARSHALL DANN
*Commissioner of Patents and Trademarks*

UNITED STATES PATENT AND TRADEMARK OFFICE

CERTIFICATE OF CORRECTION

PATENT NO. : 3,907,615

DATED : September 23, 1975

INVENTOR(S) : BERNARD H. WEIJLAND

It is certified that error appears in the above-identified patent and that said Letters Patent are hereby corrected as shown below:

On the Title page Section [60] change "Aug. 20, 1972" to --Aug. 30, 1972--.

Signed and Sealed this

Twelfth Day of October 1976

[SEAL]

*Attest:*

RUTH C. MASON
*Attesting Officer*

C. MARSHALL DANN
*Commissioner of Patents and Trademarks*